United States Patent
Kidnie et al.

(10) Patent No.: US 7,226,709 B1
(45) Date of Patent: Jun. 5, 2007

(54) DIGITAL MASK-FORMING FILM AND METHOD OF USE

(75) Inventors: Kevin M. Kidnie, St. Paul, MN (US); Pao Vang, Brooklyn Park, MN (US)

(73) Assignee: Eastman Kodak Company, Rochester, NY (US)

( * ) Notice: Subject to any disclaimer, the term of this patent is extended or adjusted under 35 U.S.C. 154(b) by 0 days.

(21) Appl. No.: 11/455,990

(22) Filed: Jun. 20, 2006

(51) Int. Cl.
*G06F 7/34* (2006.01)
*G06F 1/02* (2006.01)
*G06F 7/14* (2006.01)
*G06F 7/30* (2006.01)
*G06F 7/38* (2006.01)

(52) U.S. Cl. ............ 430/5; 430/200; 430/258; 430/262; 430/263; 430/306; 430/322; 430/327; 430/271.1; 430/964

(58) Field of Classification Search ........ 430/200, 430/964, 5, 271.1, 258, 262, 263, 306, 322, 430/327
See application file for complete search history.

(56) References Cited

U.S. PATENT DOCUMENTS

| | | | |
|---|---|---|---|
| 5,156,938 A * | 10/1992 | Foley et al. | 430/200 |
| 5,506,086 A * | 4/1996 | Van Zoeren | 430/201 |
| 5,569,569 A * | 10/1996 | Goto et al. | 430/5 |
| 5,576,142 A * | 11/1996 | Neumann et al. | 430/269 |
| 6,521,390 B1 | 2/2003 | Leinenbach et al. | |
| 6,599,679 B2 | 7/2003 | Philipp et al. | |
| 2005/0164102 A1 * | 7/2005 | Taylor | 430/18 |
| 2005/0227182 A1 | 10/2005 | Ali et al. | |

\* cited by examiner

*Primary Examiner*—Richard L. Schilling
(74) *Attorney, Agent, or Firm*—J. Lanny Tucker

(57) ABSTRACT

A masking film has a unique polymeric binder in the imageable layer that enables the imaged film to be readily solubilized in non-chlorinated developers when it is used to form a relief image in a radiation-sensitive element, such as a UV-sensitive flexographic printing plate precursor. The polymeric binders in the imageable layer are resins that can be dissolved or dispersed in cyclohexane at 10% solids at 23° C. within 24 hours.

19 Claims, No Drawings

DIGITAL MASK-FORMING FILM AND METHOD OF USE

FIELD OF THE INVENTION

This invention relates to a film that can be used to form a mask image that then can be used to form an imaged element bearing a relief image. In particular, this invention relates to mask-forming films that are readily dissolvable in environmentally friendly non-chlorinated hydrocarbon solvents.

BACKGROUND OF THE INVENTION

Radiation-sensitive elements having a laser-ablatable mask layer on the surface are known in the art. A relief image can be produced in such elements without the use of a digital negative image or other imaged element or masking device. Films with a laser-ablatable mask layer can be formed by first imagewise exposing the film with laser radiation (generally an infrared radiation laser under computer control) to selectively remove the mask layer in the exposed areas. The masking film is then placed in contact with a radiation-sensitive element and subjected to overall exposure with actinic radiation (for example, UV radiation) to cure the masking layer in the unmasked areas and to image the radiation-sensitive element through the mask. The film containing the mask layer and the imaged radiation-sensitive element (such as an imaged printing plate precursor) are then subjected to solvent development. The unexposed printing plate areas and the mask layer are completely developed off, and after drying, the resulting imaged element is useful, for example as a flexographic printing plate.

While flexographic printing plates having an integral laser-ablatable mask layer allow direct imagewise exposure using a laser and do not require a separate masking device, the time for imaging is generally too long since the system sensitivity to imaging radiation is low. Various attempts have been made in the industry to overcome this problem by increasing the infrared sensitivity of the mask layer. However, obtaining higher sensitivity has been a challenge due to the widely varying quality criteria that must be simultaneously satisfied. In addition, this approach requires the use of high-powered laser-equipped imaging apparatus that is especially configured for imaging flexographic articles. Because of the need for varying the thickness of flexographic plates depending upon the specific intended uses, more than one imaging apparatus may be required for the integral-mask approach.

An important advance in the art of making and using masking films is described in U.S. Patent Application Publication 2005/0227182 (Ali et al., hereinafter cited as U.S. Pat. No. '182). The described method provides a mask image in significantly less time due to greater imaging sensitivity.

PROBLEM TO BE SOLVED

As noted above, the mask layer and imaged radiation-sensitive element are subjected to development in various organic solvents. In the early years of this industry, perchloroethylene (PERC) and other powerful chlorinated organic solvents were used to develop imaged flexographic printing plates because they readily dissolved the polymeric materials to be removed. However, the regulation of chlorinated solvents due to environmental concerns and health hazards has prompted the use of more environmentally friendly solvents for this purpose. These non-chlorinated solvents (sometimes known as "perchloroethylene alternative solvents" or "PAS") are now widely used by flexographic printing plate makers. Such solvents generally comprise aliphatic hydrocarbons and long-chain alcohols.

However, the solvent strength of many of these non-chlorinated organic solvents is generally not as high as the chlorinated organic solvents and their use to process the mask layer and imaged flexographic printing plates can be more time-consuming.

Thus, there is a need to improve the development of masked imaged elements with mask layers. In particular, there is a need to improve this development process while using non-chlorinated organic solvents and especially for making relief images in flexographic printing plates without a loss in system sensitivity.

SUMMARY OF THE INVENTION

To address these problems, the present invention provides a film comprising a carrier sheet and having thereon an ablative imageable layer comprising a colorant and an infrared radiation absorbing compound dispersed in a polymeric binder that is a resin that can be dissolved or dispersed in cyclohexane at 10% solids at 23° C. within 24 hours.

This invention also provides a method of making a relief image, the method comprising:

A) forming a mask image by forming exposed and non-exposed regions in a film that comprises a carrier sheet and having thereon an ablative imageable layer comprising a colorant and an infrared radiation absorbing compound dispersed in a polymeric binder that is a resin that can be dissolved or dispersed in cyclohexane at 10% solids at 23° C. within 24 hours, B) transferring the mask image to a radiation-sensitive element such that the imageable layer adheres more to the radiation-sensitive element than to the carrier sheet, C) exposing the radiation-sensitive element to curing radiation through the mask image to form an imaged element, wherein the mask image is opaque to the curing radiation, and D) developing the imaged element to form a relief image.

In preferred embodiments, a method of making a relief image comprises:

A) forming a mask image by forming exposed and non-exposed regions in a film that comprises a transparent carrier sheet and having thereon, in order, a release layer, a barrier layer, and an ablative imageable layer comprising a UV-absorbing dye and an infrared absorbing compound dispersed in a polymeric binder that is an iso-butyl methacrylate polymer, B) transferring the mask image to a UV-sensitive element such that the imageable layer adheres more to the UV-sensitive element than to the transparent carrier sheet, C) exposing the UV-sensitive element to UV radiation through the mask image to form an imaged element, wherein the mask image is opaque to the UV radiation, and D) developing the imaged element to form a relief image in a developer comprising predominantly one or more long chain alcohols or aliphatic hydrocarbons.

The present invention provides an improved mask-forming film and method of using it to provide imaged elements (such as flexographic printing plates) with relief images using the non-chlorinated organic solvents that are now standard in the industry. The present invention maintains system sensitivity while improving the effectiveness of development to remove unexposed areas and the mask film.

These improvements are achieved by incorporating specific polymeric binders in the imageable layer of the mask-forming film (that is identified simply as the "film" herein).

DETAILED DESCRIPTION OF THE INVENTION

Definitions:

Unless otherwise indicated, the "film" described herein is an embodiment of the present invention. The film may also be known as a "mask element", "mask film", or "masking element". Upon imaging, the film may be known as a "mask" or "imaged film" and contains a "mask image".

Unless otherwise indicated, percentages are by weight.

The term "radiation-sensitive element" used herein includes any imageable element or material in which a relief image can be produced. Examples of radiation-sensitive elements include, but are not limited to, flexographic printing plate precursors, printed circuit boards, and lithographic printing plate precursors.

By "ablative", we mean that the imageable layer can be imaged using a thermal ablating means such as laser radiation that causes rapid local changes in the imageable layer thereby causing the material(s) in the imageable layer to be ejected from the layer. This is distinguishable from other material transfer or imaging techniques in which a chemical change rather than a physical change (for example, melting, evaporation, or sublimation) is the predominant mechanism of imaging.

Film:

The film of this invention is used to form a mask image. This film comprises one or more layers, including one or more imageable layers, disposed on a transparent carrier sheet. The film may include one or more other layers including a barrier layer, release layer, adhesive layer, or other layers generally used in the art in masking films. Different constructions of the film may be used in one or more different imaging methods.

Carrier Sheet:

The carrier sheet may be any suitable substrate and is preferably transparent but may be translucent or opaque. Useful carrier sheets include but not limited to, transparent and non-transparent polymeric films and sheets such as poly(ethylene terephthalate), poly(ethylene naphthalate), fluorine polyester polymers, polyethylene, polypropylene, acrylics, polyvinyl chloride and copolymers thereof, and hydrolyzed and non-hydrolyzed cellulose acetate. Generally, the carrier sheet is from about 20 to about 200 μm thick. For example, a transparent poly(ethylene terephthalate) sheet sold under the name of MELINEX by DuPont Teijin Films (Hopewell, Va.) is suitable for this purpose.

If necessary, the carrier sheet surface can be treated to modify its wettability and adhesion to applied coatings. Such surface treatments include but are not limited to corona discharge treatment and the application of subbing layers.

Imageable Layer(s):

The imageable layer(s) are generally disposed on the carrier sheet as relatively uniform coatings (that is, being substantially continuous and having fairly uniform thickness). In some embodiments, the imageable layer is the only layer on the carrier sheet. In other embodiments, there are multiple layers including multiple imaging layers or an imageable layer with a barrier layer or release layer as described herein.

The components of the imageable layer(s) are chosen to be soluble or swellable in suitable developers including both chlorinated organic solvents and the preferred non-chlorinated organic solvents described below that are used to create the relief image after exposure of the radiation-sensitive element to curable radiation through the imaged film.

The imageable layer(s) generally includes one or more "colorants" or substances that may or may not impart visible color in an amount of from about 10 to about 50 weight % based on total solids of the layer. The colorant is generally capable of strong absorbance of the curing radiation or is otherwise capable of blocking curing radiation. As used herein, "colorant" indicates a component that substantially prevents the transmission of curing radiation through the mask image.

The colorant may be one or more dyes or pigments, or mixtures thereof that will provide desired spectral properties. It can be a particulate material that is dispersed within the polymeric binder(s) described below. For example, they can be black dyes or pigments such as carbon black, metal oxides, and other materials described for example in U.S. Pat. No. '182 (noted above), that is incorporated herein in its entirety. It is particularly useful that the pigments or dyes be non-IR absorbing so that imaging of the radiation-sensitive element is not adversely affected. For example, the colorant can absorb UV or visible radiation, and in preferred embodiments, the colorant is an UV-absorbing dye.

In one embodiment, the colorant is a black dye or pigment that absorb energy at substantially all wavelengths across the visible spectrum, for example from about 350 to about 750 nm. The black dye or pigment may be a mixture of dyes or pigments, or mixtures of both dyes and pigments that individually may or may not be black but when mixed together provide a neutral black color. For example, a mixture NEPTUN Black, Blue Shade Magenta, and Red Shade Yellow pigment (available from BASF in Germany) that provide a neutral black color may be used. DISPERSAL CBJ (from Runnemade Dispersions KV of the UK) may also be suitable.

One suitable black pigment is carbon black of which there are numerous types with various particles sizes that are commercially available. Examples include RAVEN 450, 760 ULTRA, 890, 1020, 1250 and others that are available from Columbian Chemicals Co. (Atlanta, Ga.) as well as BLACK PEARLS 170, BLACK PEARLS 480, VULCAN XC72, BLACK PEARLS 1100 and others available from Cabot Corp. (Walthan, Mass.).

The colorant(s) may be present in the imageable layer in an amount of from about 10 to about 50 weight %, and preferably from about 10 to about 40 weight %.

It may be desirable to combine the use of carbon black with a non-infrared absorbing black dye or pigment to reduce interference with the radiation and improve the quality of the resulting film. Also suitable as a pigment is a non-carbonaceous particulate material such as metal particles or metal oxide particles.

The imageable layer(s) also includes one or more infrared radiation absorbing compounds. In some embodiments, the colorant acts in this function also but in other embodiments, a separate compound is included for this purpose, that is, to sensitize the imageable layer(s) to imaging IR radiation. Thus, the infrared radiation absorbing compound is sensitive to radiation in the range of from about 700 to about 1500 nm and preferably from about 700 to about 1200 nm. Examples of useful IR absorbing compounds include but are not limited to, cyanine infrared radiation (IR) absorbing dyes, carbon blacks, and metals such as aluminum. In one preferred embodiment, a mixture of IR dyes is used, which IR dyes can absorb at different wavelengths, for example at 830 nm and 1064 nm.

Examples of suitable IR dyes include but are not limited to, azo dyes, squarilium dyes, croconate dyes, triarylamine dyes, thiazolium dyes, indolium dyes, oxonol dyes, oxazolium dyes, cyanine dyes, merocyanine dyes, phthalocyanine dyes, indocyanine dyes, indotricarbocyanine dyes, oxatricarbocyanine dyes, thiocyanine dyes, thiatricarbocyanine dyes, merocyanine dyes, cryptocyanine dyes, naphthalocyanine dyes, polyaniline dyes, polypyrrole dyes, polythiophene dyes, chalcogenopyryloarylidene and bi(chalcogenopyrylo) polymethine dyes, oxyindolizine dyes, pyrylium dyes, pyrazoline azo dyes, oxazine dyes, naphthoquinone dyes, anthraquinone dyes, quinoneimine dyes, methine dyes, arylmethine dyes, squarine dyes, oxazole dyes, croconine dyes, porphyrin dyes, and any substituted or ionic form of the preceding dye classes. Suitable dyes are also described in U.S. Pat. No. 5,208,135 (Patel et al.), U.S. Pat. No. 6,569,603 (Furukawa), and U.S. Pat. No. 6,787,281 (Tao et al.), and EP Publication 1,182,033 (Fijimaki et al.), that are incorporated herein by reference. A general description of one class of suitable cyanine dyes is shown by the formula in paragraph [0026] of WO 2004/101280, incorporated herein by reference.

In addition to low molecular weight IR-absorbing dyes, IR dye moieties bonded to polymers can be used as well. Moreover, IR dye cations can be used as well, that is, the cation is the IR absorbing portion of the dye salt that ionically interacts with a polymer comprising carboxy, sulfo, phospho, or phosphono groups in the side chains.

Near infrared absorbing cyanine dyes are also useful and are described for example in U.S. Pat. No. 6,309,792 (Hauck et al.), U.S. Pat. No. 6,264,920 (Achilefu et al.), U.S. Pat. No. 6,153,356 (Urano et al.), U.S. Pat. No. 5,496,903 (Watanate et al.). Suitable dyes may be formed using conventional methods and starting materials or obtained from various commercial sources including American Dye Source (Baie D'Urfe, Quebec, Canada) and FEW Chemicals (Germany). Other useful dyes for near infrared diode laser beams are described, for example, in U.S. Pat. No. 4,973,572 (DeBoer).

Useful IR absorbing compounds include carbon blacks including carbon blacks that are surface-functionalized with solubilizing groups are well known in the art. Carbon blacks that are grafted to hydrophilic, nonionic polymers, such as FX-GE-003 (manufactured by Nippon Shokubai), or which are surface-functionalized with anionic groups, such as CAB-O-JET® 200 or CAB-O-JET® 300 (manufactured by the Cabot Corporation) are also useful.

The radiation absorbing compound (for example IR-absorbing compound) is generally present in an amount to provide a transmission optical density of at least 0.5 and preferably of at least 0.75, and more preferably of at least 1.0, at the exposing wavelength. Generally, this is achieved by including from about 3 to about 20 weight % of the one or more compounds, based on the solids content of the imageable layer. For example, the IR absorbing compound should be sufficient to produce transparent areas where the film is exposed to infrared radiation, meaning that such areas would have a transmission optical density of about 0.5 or less, and preferably of 0.1 or less, as measured using a suitable filter on a conventional densitometer.

In other embodiments, the radiation absorbing compound may include an ultraviolet absorber that absorbs radiation at from about 150 to about 400 nm. The UV absorber can be used as the only radiation absorbing compound or in combination with an IR absorber compound.

The imageable layer can optionally include a fluorocarbon additive for enhancing transfer of a molten or softened film and production of halftone dots (that is, pixels) having well-defined, generally continuous, and relatively sharp edges. Examples of useful fluorocarbon additives and amounts are provided in [0087] to [0089] of U.S. Pat. No. '182 (noted above).

It may also be desirable to include a "latent crosslinking agent" (LIFT) that is capable of causing crosslinking only under conditions of laser ablation. Suitable crosslinking agents of this type and useful amounts are also described in [0090] to [0093] of U.S. Pat. No. '182 (noted above).

Additional optional components of the imageable layer(s) include but are not limited to, plasticizers, coating aids or surfactants, dispersing aids, UV absorbers, and fillers, all of which are well known in the art as described for example in [0094] to [0096] of U.S. Pat. No. '182 (noted above).

All of the components described above for the imageable layer(s) are dispersed in one or more polymeric binders (both synthetic and naturally occurring polymeric materials) that are capable of dissolving or dispersing the other components in the imageable layer. The one or more polymeric binders are generally present in an amount of from about 25 to about 75 weight %, and preferably from about 35 to about 65 weight %, based on the total dry weight of the imageable layer.

While a wide variety of polymeric binders can be used, the advantages of the present invention are readily achieved by using certain "primary" polymeric binders in an amount of at least 50 weight %, and preferably at least 70 weight % and up to 100 weight %, of the total polymeric binder weight. These primary polymeric binders have been found to be readily dissolved or dispersed is the non-chlorinated organic solvents described below as developers. They may also be dissolvable or dispersible in chlorinated organic solvents also but the use of those solvents is discouraged in the art.

To determine what polymeric resins are useful as primary polymeric binders, one can mix a chosen resin in cyclohexane (at 10% solids) at 23° C. for 24 hours to determine if the resin is dissolved or dispersed (without settling) in the cyclohexane. Primary polymeric binders may have varying solubility or dispersibility, but they will generally meet this "Cyclohexane Test".

Particularly useful classes of primary polymeric binders that meet the Cyclohexane Test include but are not limited to, terpene resins, phenolic resins, aromatic hydrocarbon resins, polyurethanes (including polyether polyurethanes), long-chain acrylate and methacrylate resins. Useful terpene resins include but are not limited to the SYLVARES terpene resins such as SYLVARES TR-A25 terpene resin that is available from Arizona Chemical Co. (Jacksonville, Fla.). Useful phenolic resins include but are not limited to, novolac resins such as CK2500 and CK2400 novolac resins that are available from Georgia Pacific Resins (Atlanta, Ga.). Aromatic hydrocarbon resins include but are not limited to, NORSOLENE® resins such as NORSOLENE® S-155 resin that are available from Sartomer Co. (Warrington, Pa.). Useful polyurethanes include but are not limited to, SURKOPAK® 5245 and SURKOFILM® 72S polyurethane resins that are available from Tennants Inks & Coatings Supplies, Ltd. (Surrey, UK) and NeoRez 322 polyurethane resin that is available from DSM NeoResins (Wilmington, Mass.). Long chain acrylate and methacrylate resins include those vinyl polymers derived from one or more long chain acrylate or methacrylate monomers wherein the long alkyl chain has at least 3 carbon atoms. Such monomers include but are not limited to, iso-butyl methacrylate, n-butyl methacrylate, and mixtures thereof.

Particularly useful primary polymeric binders are homopolymers and copolymers derived from at least iso-butyl methacrylate, n-butyl methacrylate, or mixtures thereof. Commercially available primary polymeric materials of this type include ELVACITE® 2045 and ELVACITE® 2046 polymers that are available from Lucite International (Cordova, Tenn.).

For example, it was found that the commercial polymers available as SURKOPAK® 5245 polyurethane resin and SURKOFILM® 72S polyurethane resin, ELVACITE® 2045 polymeric material, and CK 2500 novolac resin met the Cyclohexane Test. However, nitrocellulose, BUTVAR® 76 poly(vinyl butyral), and ELVACITE® 2021 poly(methyl methacrylate) did not meet the Cyclohexanone Test.

"Secondary" polymeric binders may be included with the primary polymeric binders that meet the Cyclohexane Test. These secondary polymeric binders are not likely to meet the Cyclohexane Test but they are also generally soluble or dispersible in the developers described below and can be included in an amount of less than 50 weight % of the total binder weight. These secondary polymeric binders may be known as "adhesive binders" as described for example in [0081] of U.S. Pat. No. '182 (noted above). Examples of suitable adhesive binders include but are not limited to, acetyl polymers such as poly(vinyl butyral)s that can be obtained for example as BUTVAR® B-76 from Solution, Inc. (St. Louis, Mo.) and acrylamide polymers that can be obtained as MACROMELT 6900 from Henkel Corp. (Gulph Mills, Pa.). Pressure-sensitive adhesive polymers may also be used for this purpose.

Other useful secondary polymeric binders are resins having hydroxyl groups (or hydroxylic polymers) as described in [0082] to [0084] of US '182 (noted above) and include for example poly(vinyl alcohol)s and cellulosic polymers (such as nitrocellulose). Still further secondary polymeric binders are non-crosslinkable polyesters, polyamides, polycarbamates, polyolefins, polystyrenes, polyethers, polyvinyl ethers, polyvinyl esters, and polyacrylates and polymethacrylates having alkyl groups with 1 and 2 carbon atoms.

Release Layer:

In preferred embodiments, the film can include a "release layer" disposed between the carrier sheet and the imageable layer(s). More preferably, the release layer is directly disposed onto the carrier sheet. The presence of a release layer may be desirable to facilitate the transfer of imageable layer to a receptor sheet, or the transfer of a resulting mask image to the radiation-sensitive element. It is preferred that the release layer be developable, dispersible, or easily removable after curing through the mask image during subsequent processing (development) of the imaged element. Furthermore, it is desirable that the release layer does not significantly absorb or scatter the curing radiation. For example, it is preferred that is does not include matte agents or other light scattering materials.

Representative coatings suitable for use as a release layer include but not limited to poly(vinyl alcohols) or similar polymers, cellulosic polymers such as methyl cellulose or hydroxypropyl methyl cellulose, poly(vinyl butyral), or hydrolyzed styrene maleic anhydride. In some embodiments, the release layer can include one or more polymers that provide a desired oxygen permeability that affects the subsequent imaging of the radiation-sensitive material.

The release layer may be relatively thin and have a dry thickness of from about 0.1 to 10 µm. A combination of a thin release layer having desired low oxygen permeability from the presence of specific polymers may provide the optimum performance of curability (for durability) and dot sharpness.

In other embodiments, the release layer is a thermally resistant polymer layer that has desired layer integrity and good release properties after thermal imaging. Thermally resistant polymers include but are not limited to, polyimides, polysulfones, polyether ethyl ketone, bisphenol-A terephthalate, poly(vinyl alcohols), and polyamides, and can be optimized to provide desirable release properties, curability, and developability.

The release layer may also include crosslinking agents to improve release properties, coating aids, surfactants, and release-enhancing agents. Further details of useful release layer compositions are provided in U.S. Pat. No. '182 (noted above), incorporated herein by reference in its entirety.

Barrier Layer:

The film of this invention can also include a barrier layer disposed between the carrier sheet and the imageable layer(s). In preferred embodiments, the barrier layer is disposed over the release layer and under a single imageable layer. Suitable barrier layers and their compositions are also described in U.S. Pat. No. '182 (noted above) and references cited therein. For example, the barrier layer may include one or more polymer binders, particularly, "heat-combustible" polymer binders such as poly(alkyl cyanoacrylate)s and nitrocellulose, and particulate materials such as metal oxide particles (for example, iron oxide particles) to provide high optical density with respect to imaging or curing radiation. Metal oxide particles may be useful for ablative imaging because they can thermally decompose to generate propulsive gases.

The barrier layer may optionally include an infrared absorbing compound, such as infrared absorbing dyes (IR dyes) including cationic infrared-absorbing dyes and photothermal-bleachable dyes, and crosslinking agents such as melamine-formaldehyde resins, dialdehydes, phenolics, polyfunctional aziridines, isocyanates, and urea-formaldehyde epoxies to provide greater thermal resistance.

Other Film Components:

An adhesive layer can be present in the film overlying the imageable layer(s) to enhance adhesion of the mask image to the radiation-sensitive element during transfer and to aid in the transfer of the mask image. The adhesive layer may comprise a thermoplastic, thermal adhesive, or pressure-sensitive adhesive that is well known in the art.

Receptor Sheet:

In some embodiments of this invention, a receptor sheet can be employed in contact with the outermost imageable layer of the film. "Receptor sheet" refers to a material, generally in sheet-form, having at least one major surface that is capable of receiving the imageable layer(s) from the film. In other embodiments, the receptor sheet is designed to imagewise accept imageable layer(s) or colorants (in exposed regions) transferred from the film in transfer imaging. The receptor sheet can then be removed from the film. For these embodiments, the receptor sheet includes a sheet substrate having an image-receiving side and a non-imaging side. Further details of receptor sheets, its layers, composition, and properties, are provided in U.S. Pat. No. '182 (noted above). To promote transfer in a melt-stick system, it may be suitable to use similar or identical binders for both the receptor sheet coatings and the imageable layers.

Radiation-Sensitive Elements

Considerable details of useful radiation-sensitive elements such as flexographic printing plate precursors, printed circuit boards, and lithographic printing plates are provided in U.S. Pat. No. '182 (noted above). Such elements include a suitable dimensionally stable substrate, at least one radiation-sensitive layer, and optionally a separation layer, cover sheet, or metal layer. Suitable substrates include dimensionally stable polymeric films and aluminum sheets. Polyester films are preferred. Any radiation-sensitive element that is capable of producing a relief image using the film described herein is useful in the practice of this invention.

The radiation-sensitive element can be positive- or negative-working, but preferably, it is negative-working and generally includes a visible- or UV-sensitive imageable layer containing a visible-radiation or UV-radiation curable composition that is cured or hardened by polymerization or crosslinking upon exposure to the curing radiation. Preferably, the radiation-sensitive element is UV-sensitive. Many details of various components of the radiation-sensitive element are provided in U.S. Pat. No. '182 (noted above), and references cited therein.

Preferred embodiments also include a removable cover sheet as well as a separation layer that protects the radiation-sensitive imageable layer from fingerprints and other damage and that is disposed between the radiation-sensitive imageable layer and the cover sheet. Useful separation layer materials include but are not limited to, polyamides, poly (vinyl alcohols), copolymers of ethylene and vinyl acetate, amphoteric interpolymers, cellulosic polymers, poly(vinyl butyral), cyclic rubbers, and combinations thereof.

The radiation-sensitive imageable layer can include an elastomeric binder, at least one monomer, and an initiator that is sensitive to non-IR radiation. In most cases, the initiator will be sensitive to UV or visible radiation and preferably UV radiation. Suitable initiator compositions include but are not limited to, those described in U.S. Pat. No. 4,323,637 (Chen et al.), U.S. Pat. No. 4,427,749 (Gruetzmacher et al.), and U.S. Pat. No. 4,894,315 (Feinberg et al.), all of which are incorporated herein by reference.

The elastomeric binder can be a single or mixture of polymers that may be soluble, swellable, or dispersible in aqueous, semi-aqueous, or organic solvent developers and include but are not limited to, binders that are soluble, swellable, or dispersible in organic solvents such as natural or synthetic polymers of conjugated diolefins, block copolymers, core-shell microgels, and blends of microgels and preformed macromolecular polymers. The elastomeric binder can comprise at least 65% of the imageable layer based on total layer solids. More details of such elastomeric binders are provided in [0190] of U.S. Pat. No. '182 (noted above) and references cited therein.

The imageable layer can also include a single monomer or mixture of monomers that must be compatible with the elastomeric binder to the extent that a clear, non-cloudy radiation-sensitive layer is produced. Monomers for this purpose are well known the art and include ethylenically unsaturated polymerizable compounds having relatively low molecular weight (generally less than 30,000 Daltons, and preferably less than 5000 Daltons). Examples of suitable monomers include various mono- and polyacrylates, acrylate derivatives of isocyanates, esters, and epoxides. Specific monomers are described in [0191] of U.S. Pat. No. '182 (noted above) and in references cited therein.

The photoinitiator may be a single compound or combination of compounds that are sensitive to visible or UV radiation and that generate free radicals that initiate the polymerization of the monomer(s) without excessive termination and are generally present in an amount of from about 0.001 to about 10% based on the total dry weight of the imageable layer. Examples of suitable initiators include substituted or unsubstituted polynuclear quinines and further details are provided in [0192] of U.S. Pat. No. '182 (noted above) and in references cited therein.

The radiation-sensitive layer can include other addenda that provide various properties including but not limited to sensitizers, plasticizers, rheology modifiers, thermal polymerization inhibitors, tackifiers, colorants, antioxidants, antiozonants, and fillers.

The thickness of the radiation-sensitive layer may vary depending upon the type of imaged plate desired. In one embodiment, a UV-sensitive layer may from about 500 to about 6400 µm and more particularly from about 500 to about 2500 µm.

In one embodiment, the radiation-sensitive element is a flexographic printing plate precursor that includes a suitable UV-curable resin and when exposed and processed, provides a flexographic printing plate. Such elements generally include a suitable substrate, one or more UV-sensitive imageable layers comprising a photosensitive material that include a polymer or prepolymer. Examples of commercially available flexographic printing plate precursors include but are not limited to, FLEXCEL flexographic elements available from Kodak Polychrome Graphics, a subsidiary of Eastman Kodak Company (Norwalk, Conn.), CYREL® Flexographic plates available from DuPont (Wilmington, Del.), NYLOFLEX® FAR 284 plates available from BASF (Germany), FLEXILIGHT CBU plate available from Macdermid (Denver, Colo.), and ASAHI AFP XDI available from Asahi Kasei (Japan).

The radiation-sensitive element may also be used to form printed circuit board wherein a conducting layer (also known as a "printing circuit") is formed on a substrate in the pattern dictated by the mask image. Suitable precursors to printed circuit boards generally comprise a substrate, a metal layer, and a photosensitive layer. Suitable substrates include polyimide films, glass-filled epoxy or phenol-formaldehyde or any other insulating materials known in the art. The metal layer covering the substrate is generally a conductive metal such as copper or an alloy or metals. The photosensitive layer may include an UV-curable resin, monomers, or oligomers, photoinitiators, and a binder. The photosensitive layer in the printed circuit board precursor may be a positive- or negative-working layer. Further details of printed circuit boards are provided in [0196] to [0205] of US/182 (noted above)

Forming a Mask Image:

In the practice of this invention, a mask image is formed on either a carrier sheet or a receptor sheet. Forming a mask generally includes producing exposed and non-exposed regions in the imageable layer of the film. The choice of imaging mechanism will determine the possible variations in forming the mask image, as described below.

Exposing the film can be carried out in selected regions, otherwise known as "imagewise exposure". Both analog and digital methods can be used for imagewise exposure and are conventional in the art. Digital methods are preferred. In some embodiments, imagewise exposure can be accomplished using laser radiation from a laser that is scanned or rasterized under computer control. Any of the known scanning devices can be used including flat-bed scanners, external drum scanners, and internal drum scanners. In these devices, the film is secured to the drum or bed, and the laser beam is focused to a spot that can impinge on the film. Two or more lasers may scan different regions of the film simultaneously.

In preferred embodiments, the film can be exposed to infrared radiation, for example, in the range of from about 700 to about 1400 nm. Such films contain one or more infrared radiation absorbing compounds as described above to provide sensitivity to infrared radiation. In these embodiments, the film may be suitably mounted to an infrared imager and exposed to the infrared radiation using an infrared laser such as a diode laser or Nd:YAG laser that may be scanned under computer control. Suitable infrared imagers include but are not limited to DESERTCAT 88 imagers available from ECRM (Tewksbury, Mass.) used in color proofing, TRENDSETTER imagesetters and ThermoFlex Flexographic CTP imagers available Creo, a subsidiary of Eastman Kodak Company (Burnaby, British Columbia, Canada) used for CTP lithographic plate applications and for imaging flexographic elements, DIMENSION imagesetters available from Presstek (Hudson, N.H.) useful for CTP lithographic plate applications, CYREL® Digital Imager (CDI SPARK) available from Esko-Graphics (Kennesaw, Ga.), and OMNISETTER imagers available from Misomex International (Hudson, N.H.) useful for imaging flexographic elements.

In other embodiments, the film is exposed to visible laser light, for example in the range of from about 400 to about 750 nm. Commercially available filmsetters and imagesetters can be used including but not limited to, ACCUSET Plus imagesetter (visible red laser diode, 670 nm) and ADVANTAGE DL3850 imagesetter (410 nm), SELECT-SET 5000 imagesetter (HeNe, 630 nm), all available from Agfa-Gevaert (Belgium), LUXEL V-9600 (410 nm) available from Fuji Photo Film (Japan), and DIAMONDSETTER imagesetter (frequency-doubled Nd-YAG laser, 532 nm) available from Western Lithotech (St. Louis, Mo.).

In still other embodiments, the film can be exposed to ultraviolet radiation by laser direct imaging in the range of from about 150 to about 410 nm. Apparatus useful for such imaging include but are not limited to, DP-100 imagers available from Orbotech (Billerica, Mass.) and DIGIRITE 2000 imager available from Etec Systems (Tucson, Ariz.).

The step of forming the mask image may also include a step of removing either exposed or non-exposed regions of the radiation-sensitive imageable layer. In some embodiments, the exposed regions are removed from the carrier sheet, leaving a mask image on the transparent carrier sheet. For these embodiments, a receptor sheet may optionally be used for removing waste imageable layer. Such a receptor sheet may be any suitable paper, transparent film, or metal sheet to which one or more coatings have been applied before irradiation of the films to facilitate transfer of the imageable layer to the receptor. After imaging, the receptor sheet may be removed from the film to reveal the mask image on the carrier sheet. A complementary image to the mask image may remain on the receptor sheet.

In other embodiments, a mask image is formed on the carrier sheet by producing exposed and non-exposed regions of the imageable layer, and removing non-exposed regions from the carrier sheet.

In some embodiments, the mask image residing on the carrier sheet may be cured by subjecting it to heat treatment, provided that the transfer property of the mask image is not adversely affected. Heat treatment may be done by a variety of means including but not limited to, storage in an oven, hot air treatment, or contact with a heated platen or passage through a heated roller device. Heat treatment is not necessary for curing to take place.

In still other embodiments, a mask image can be formed as noted above and the exposed regions are transferred to a receptor sheet. The receptor sheet it then removed from the mask image before the mask image is transferred to a radiation-sensitive element. The film may be provided with a receptor sheet in contact with the radiation-sensitive element, or the element is contacted with a separate receptor sheet.

Where a separate receptor sheet is used during imaging, the film and receptor sheet are assembled in close proximity prior to imaging, with the image-receiving side of the receptor sheet adjacent to the imageable layer. The term "close proximity" in this context can mean that the imageable layer and receptor sheet are brought into contact, or that they do not contact each other but are sufficiently close to allow transfer of imageable layer or colorant upon exposure to imaging radiation. Vacuum hold-down or a mechanical means may be used to secure the film and receptor sheet in assembly.

Next, the assembly of the donor and receptor sheets is imagewise exposed using imaging radiation to form a mask image, as described below.

Imagewise exposure causes imagewise transfer of imageable layer or colorant from the film to the receptor sheet. After imaging, the film may be removed from the receptor sheet to reveal the mask image on the receptor sheet.

Several imaging mechanisms are mentioned briefly below and further details are provided by U.S. Pat. No. '182 (noted above) and references cited therein beginning with paragraphs [0142].

Ablation:

In this mechanism, the exposed regions of the imageable layer are removed from the carrier sheet by the generation of a gas. Specific binders that decompose upon exposure to heat (such as IR laser irradiation) to rapidly generate a gas may be used. This action is to be distinguished from other mass transfer techniques in that a chemical rather than a physical change cases an almost complete transfer of the imageable layer rather than a partial transfer. By an ablative mechanism, a mask image may be generated on a carrier sheet using a suitable film. A mask image may also be generated on a suitable receptor sheet by an ablative mechanism.

Melt-Stick Technique:

The exposed areas of the imageable layer can be transferred in a molten or semi-molten state from the carrier sheet to a suitable receptor sheet upon exposure to radiation. The exposed areas are characterized by reduced viscosity that provides flowability to the imageable layer that flows across to and adheres to the surface of the receptor sheet with greater strength than it adheres to the carrier sheet. Following this physical transfer, the carrier sheet, along with the untransferred imageable layer, is separated from the receptor sheet.

In one embodiment, the mask image comprises the non-exposed regions remaining on the carrier sheet. In another embodiment, the mask image comprises the exposed regions of the imageable layer that are transferred to the receptor sheet.

Laser-Induced Film Transfer:

With this imaging mechanism, the exposed regions of the imageable layer are removed from the carrier sheet through laser-induced film transfer ("LIFT"). A release layer containing a latent crosslinking agent is disposed between the carrier sheet and the imageable layer. The latent crosslinking agent reacts with the binder to form a high molecular weight network in the exposed regions to provide better control of melt flow phenomena, transfer of more cohesive material to the receptor sheet, and high quality edge sharpness of the mask image.

In one embodiment, the imageable layer includes a transferable colorant and an infrared absorbing dye (IR dye). In another embodiment, the imageable layer includes a transferable colorant, a polymeric binder as described above, a fluorocarbon additive, a cationic IR dye, and latent crosslinking agent as described above.

The mask image can comprise the non-exposed regions of the imageable layer remaining on the carrier sheet, but in other embodiments, the mask image comprises the exposed regions that are transferred to the receptor sheet.

Peel-Apart:

In this imaging mechanism, the exposed regions of the imageable layer are removed from the carrier sheet using a suitable receptor sheet based differential adhesion properties in the imageable layer. After imagewise exposure of the film, the receptor sheet is separated from the carrier sheet and either exposed or non-exposed regions remain on the carrier sheet.

Dye Sublimation or Diffusion:

In yet another imaging technique, colorant from exposed regions of the imageable layer is removed through sublimation wherein the colorant is diffused or sublimed without simultaneous transfer of the binder. A mask image may be generated on a carrier sheet without the need for a receptor sheet. In other embodiments, a receptor sheet is used to capture the sublimed colorant. The mask image then comprises the imageable layer remaining on the carrier sheet. In still other embodiments, the mask image comprises the colorant that is transferred to a receptor sheet.

Alkaline Development:

The exposed regions of the imageable layer can also be removed by conventional alkaline development when the film is washed with a suitable alkaline developer while non-exposed regions remain on the carrier sheet. The imageable layer is positive-working in this instance and can be composed of any of the known positive-working compositions. The developer has a pH of from about 9 to about 14 and comprises water and a hydroxide.

Alternatively, the non-exposed regions of the imageable layer are removed from the carrier sheet to produce a mask image. Such imageable layer compositions are negative-working and become insoluble in the developer upon exposure. Useful developers for such materials generally have a pH of from about 7 to about 13 and include water-miscible high-boiling organic solvents.

Useful developers for these materials are well known and available from several sources including Kodak Polychrome Graphics, a subsidiary of Eastman Kodak Company (Norwalk, Conn.).

Silver Halide Emulsion:

Another imaging technique causes a physical or chemical change in the imageable layer that changes the degree of opacity or transparency to curing radiation. One such imaging method incorporates a silver halide emulsion as the imageable layer. Such silver-containing emulsions can include silver halide photographic emulsions, silver halide-organic silver salt photothermographic emulsions, and organic silver salt thermographic emulsions.

Once the mask image has been formed, it is transferred to a suitable radiation-sensitive element (described above) that is sensitive to curing radiation. In some embodiments, the mask image includes the exposed regions of the imageable layer, but in other embodiments, the mask image includes the non-exposed regions.

Mask image transfer includes placing the mask image and the accompanying carrier sheet or receptor sheet onto or in proximity with the radiation-sensitive element with the mask image. If the radiation-sensitive element is disposed between a substrate and a cover sheet, the cover sheet or the substrate should be removed before placing the mask image in proximity to the radiation-sensitive element. If a separation layer is included in the radiation-sensitive element, the mask image may optionally be transferred so that the separation layer remains between the mask image and the radiation-sensitive element.

In one embodiment, the step of transferring the mask image may include laminating it to the radiation-sensitive element by applying pressure or heat, or both pressure and heat.

Commercially available laminators that provide both heat and pressure may be used including but not limited to, KODAK model 800XL APPROVAL LAMINATOR available from Eastman Kodak Company (Rochester, N.Y.), CODOR LPP650 LAMINATOR available from CODOR (Amsterdam, Holland), and LEDCO HD laminators available from Filmsource (Casselbury, Fla.). A protective cover sheet, if present, is removed before lamination. The assembled mask image and radiation-sensitive element are fed into the laminator at the desired speed, temperature, and pressure. After laminating is completed, the carrier sheet on the imaged mask film is simply peeled away. A representative example of this process is shown in the examples below. Alternatively, the carrier sheet can be left in place during exposure of the radiation sensitive element to radiation, and then it is removed as the element is further processed.

In another embodiment, mask image transfer can be achieved by selective adhesion of the mask image to the radiation-sensitive element and removal of the carrier sheet.

In still another embodiment, transfer of the mask image can be achieved by using pressure-sensitive adhesion when the mask image and radiation-sensitive element are pressed into contact with each other. A pressure-sensitive adhesive may be incorporated into the radiation-sensitive element, or it may be placed in a separate layer between the imageable layer and the radiation-sensitive element. Suitable pressure-sensitive adhesives are known in the art.

In some embodiments, at least portions of a release layer are transferred along with the mask image to provide desired oxygen permeability. At least portions of the release layer corresponding to the transferred mask image are transferred. In other embodiments, the release layer may be a transferred image (that is, contiguous). The transferred release layer can originate from the film or from a receptor sheet.

Generally, the carrier sheet or receptor sheet ("sheet") is removed from the mask image on the imaged radiation-sensitive element. In some embodiments, the sheet is removed before exposing the radiation-sensitive element to curing radiation. This may be done for a number of known advantages. In other embodiments, the sheet is removed only after exposing the radiation-sensitive element to curing radiation. In either case, the sheet may be separated by peeling the sheet away from the mask image manually or mechanically. This may be facilitated if the film includes a release layer. The sheet may also be removed by dissolving or dispersing it in a suitable solvent, or by causing adhesion failure between the sheet and the mask image. The presence of a release may also facilitate this procedure.

Exposure of Radiation-Sensitive Element

The radiation-sensitive element is exposed to curing radiation through the mask image to form an imaged element. In this step, the curing radiation is projected onto the radiation-sensitive element through the mask image that preferentially blocks some of the radiation. In unmasked regions, curing radiation will cause hardening or curing of the radiation-sensitive composition(s). The mask image should therefore be substantially opaque to the exposing radiation, meaning that the mask image should have a transmission optical density of 2 or more and preferably 3 or more. The unmasked regions should be substantially transparent meaning that the unmasked regions of the radiation-sensitive element should have a transmission optical density of 0.5 or less, preferably 0.1 or less, and more preferably 0.05 or less. Transmission optical density can be measured using a suitable filter on a densitometer, for example, a MACBETH TR 927 densitometer.

Generally, exposure of the radiation-sensitive element through the mask image is accomplished by floodwise exposure from suitable irradiation sources (visible radiation or preferably UV radiation). Exposure can be carried out in the presence of atmospheric oxygen or in a vacuum.

In the manufacture of a relief printing plate, such as a flexographic printing plate, one side of the radiation-sensitive element is generally first exposed to curing radiation through a transparent support (known as "back exposure") to prepare a thin, uniform cured layer on the support side of the element. The radiation-sensitive element is then exposed to curing radiation through the mask image, thereby causing the radiation-sensitive composition to harden or cure in the unmasked areas. Unexposed and uncured regions of the radiation-sensitive element are then removed by a developing process (described below), leaving the cured regions that define the relief printing surface.

The wavelength or range of wavelengths suitable as the curing radiation will be dictated by the nature of the radiation-sensitive element. In preferred embodiments, the curing radiation is ultraviolet radiation at a wavelength of from about 340 to about 400 nm. Sources of visible or UV radiation for floodwise or overall exposure include but are not limited to, carbon arcs, mercury-vapor arcs, fluorescent lamps, electron flash units, and photographic flood lamps. UV radiation is particularly useful from mercury-vapor lamps and more particularly sun lamps. Representative UV radiation sources include SYLVANIA 350 BLACKLIGHT fluorescent lamp (FR 48T12/350 VL/VHO/180, 115 watts) that has a central emission wavelength of about 354 nm that is available from Topbulb (E. Chicago, Ind.), and BURGESS EXPOSURE FRAME, Model 5K-3343VSII with ADDALUX 754-18017 lamp available from Burgess Industries, Inc. (Plymouth, Mass.).

Other suitable sources of UV radiation include platemakers that are able to both expose the radiation-sensitive element to radiation and to develop the element after radiation exposure. Examples of suitable platemakers include but are not limited to, KELLEIGH MODEL 310 PLATEMAKER available from Kelleigh Corporation (Trenton, N.J.) and the GPP500F PLATE PROCESSOR available from Global Asia Ltd. (Hong Kong).

The time for exposure through the mask image will depend upon the nature and thickness of the radiation-sensitive element and the source of the radiation. For example, in one of embodiment, a FLEXCEL-SRH plate precursor available from Kodak Polychrome Graphics (Norwalk, Conn.) may be mounted on a KELLEIGH MODEL 310 PLATEMAKER and back exposed to UV-A radiation through the support for 35 seconds to prepare a thin, uniform cured layer on the support side of the element. The mask image may then be transferred to the separation layer of the FLEXEL-SRH plate precursor, and the assembly may then be exposed to UV-A radiation through the mask image for about 14 minutes.

Development

The exposed element (or imaged element) is then developed with a suitable developer to form a relief image. Development serves to remove the uncured regions of the radiation-sensitive element, leaving the cured regions that define the relief image on the substrate. The mask image will also be removed during development.

Any known developer for the imaged element can be used in this processing step, including the chlorinated organic solvents that have environmentally disadvantageous.

Preferred developers useful in this invention are predominantly non-chlorinated organic solvents. By "predominantly", we mean that more than 50% (by volume) of the developer comprises one or more non-chlorinated organic solvents such as aliphatic hydrocarbons and long chain alcohols (that is alcohols with at least 7 carbon atoms). The remainder of the solutions can be chlorinated organic solvents, but preferably, the chlorinated organic solvents comprise less than 50% (by volume) of the developer.

Thus, the useful developers are predominantly what are known as "perchloroethylene alternative solvents" (PAS). These PAS are generally volatile organic compounds typically comprised of mixtures of aliphatic hydrocarbons and long-chain alcohols. They are generally stable under normal room temperature and storage conditions. Examples of such commercially available solvents include but are not limited to, PLATESOLV available from Hydrite Chemical Co. (Brookfield, Wis.), NYLOSOLV® available from BASF (Germany), FLEXOSOL® available from DuPont (Wilmington, Del.), OptiSol® available from DuPont (Wilmington, Del.), and SOLVIT® QD available from MacDermid (Denver, Colo.). The SOLVIT® QD commercially available solvent is most preferred.

Development is usually carried out under conventional conditions such as for from about 5 to about 20 minutes and at from about 23 to about 32° C. The specific development conditions will be dictated largely by the type of developing apparatus and specific developer that are used.

Post-development processing of the relief image may be suitable under some circumstances. Typical post-development processing includes drying the relief image to remove any excess solvent ad post-curing by exposing the relief image to curing radiation to cause further hardening or crosslinking. The conditions for these processes are well known to those skilled in the art. For example, the relief image may be blotted or wiped dry, or dried in a forced air or infrared oven. Drying times and temperatures would be apparent to a skilled artisan. Post-curing may be carried out using the same type of radiation previously used to expose through the mask image.

Detackification (or "light finishing") may be used if the relief image surface is still tacky. Such treatments, for example, by treatment with bromide or chlorine solutions or exposure to UV or visible radiation, are well known to a skilled artisan.

The resulting relief image may have a depth of from about 2 to about 40% of the original thickness of the radiation-sensitive element imageable layer. For a flexographic printing plate, the depth of the relief image may be from about 150 to about 500 μm. For a printed circuit board, the imageable layer is completely removed in either the exposed or non-exposed regions, to reveal the metal layer underneath. Thus, in such elements, the depth of the relief image depends upon the thickness of the imageable layer.

The following examples illustrate the practice of this invention but the invention is not to be limited thereby.

EXAMPLES

The following materials and methods were used in the examples:

AIRVOL® 205 premix solution is a 10% solids aqueous solution of a poly(vinyl alcohol) that was obtained from Air Products (Allentown, Pa.).

BUTVAR® B-76 is a poly(vinyl butyral) resin that was obtained from Solutia, Inc. (St. Louis, Mo.).

CK-2500 is a novolac resin that was obtained from Georgia Pacific (Atlanta, Ga.).

Curcumin is a yellow dye that was obtained from Cayman Chemicals (Ann Arbor, Mich.).

D99 is IR Dye YKR-2900 that was obtained from Mitsui, USA (New York, N.Y.).

ELVACITE® 2045 is a poly(iso-butyl methacrylate) that was obtained from DuPont (Wilmington, Del.). The ELVACITE 2045 "premix" was 10% in MIBK.

EPOLIGHT™ 1178 is an IR dye that was obtained from Epolin Inc. (Newark, N.J.).

FC 4432 is a 10% solids solution of NOVEX fluorosurfactant that was obtained from 3M Corporation (St. Paul, Minn.).

FC 55/35/10 is a fluorocarbon made of a 55:35:10 ratio mixture of a terpolymer of a fluorinated acrylate, a short chain alkyl acrylate, and a polar monomer as a 7.5% total solids solution in methyl ethyl ketone unless otherwise indicated, that was obtained from 3M Company (St. Paul, Minn.).

FLEXOSOL® washout solution is a developer that contains predominantly non-chlorinated hydrocarbons and that was obtained from DuPont (Wilmington, Del.).

GANTREZ® S-97BF is a 10% solids aqueous solution of a polymethyl vinyl ether/maleic anhydride copolymer that was obtained from International Specialty Products, Inc. (Wayne, N.J.).

MEK represents methyl ethyl ketone.

MIBK represents methyl iso-butyl ketone.

NeoRex 322 polyurethane resin was obtained from DSM NeoResins (Wilmington, Mass.).

Nitrocellulose was obtained from Aldrich Chemical Company (Milwaukee, Wis.). The nitrocellulose "premix" was 5% in MIBK.

NYLOSOLV® washout solution is a developer that contains predominantly non-chlorinated hydrocarbons and that was obtained from BASF (Germany).

OptiSol® washout solution is a developer (or "washout" solution) that containing predominantly chlorinated hydrocarbons and that was obtained from DuPont (Wilmington, Del.).

PC 364 is an infrared radiation absorbing dye that was obtained from St. Jean Photochemicals (Quebec, Canada).

PCA represents a mixture of 70% (weight) poly(methyl cyanoacrylate) and 30% (weight) poly(ethyl cyanoacrylate) as a 10% total solids solution in 50/50 cyclopentanone/acetone, that was obtained from Eastman Kodak Company (Rochester, N.Y.).

PEG 400 is a polyethylene glycol that was obtained from Aldrich Chemicals Co. (St. Louis, Mo.).

PLATESOLV is a developer that contains predominantly non-chlorinated hydrocarbons and that was obtained from Hydrite Chemical Co. (Brookfield, Wis.).

PVA 523 is a 10% solids aqueous solution of a poly(vinyl alcohol) that was obtained from Air Products (Allentown, Pa.).

RICOBOND 2031 is a polybutadiene resin with maleic anhydride units that was obtained from Sartomer Co. (Warrington, Pa.).

SANTICIZER® 160 is a butyl benzyl polymer that was obtained from Ferro Corporation (Walton Hills, Ohio).

Solvent PM is propylene glycol monomethyl ether that was obtained from Eastman Chemicals Company (Kingsport, Tenn.).

SOLVIT® QD washout solution is a developer that contains predominantly non-chlorinated hydrocarbons and that was obtained from MacDermid Co. (Denver, Colo.).

Sudan Black is a black dye that was obtained from Aldrich Chemicals Co. (Milwaukee, Wis.).

SYLOJET® P405 is a silica gel that was obtained from Grace Davison (Columbia, Md.).

TRITON® X-100 nonionic surfactant (10% solids in water) was obtained from Rohm & Haas (Philadelphia, Pa.).

IR Dye A is an IR absorbing dye having the following structure and was obtained from Eastman Kodak Company (Rochester, N.Y.).

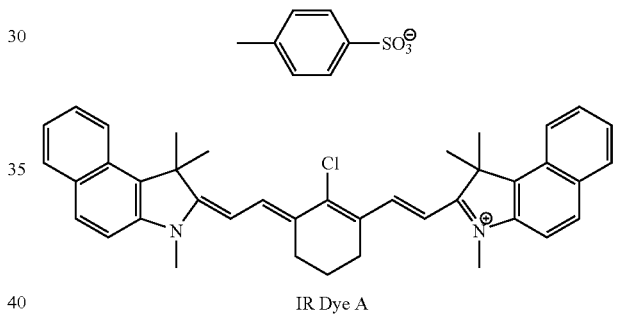

IR Dye A

UVINUL® 3050 is an ultraviolet radiation absorbing dye that was obtained from BASF (Germany).

Examples 1 & 2

Relief Mask Films and Developer Evaluations

Control and two films of the present invention were prepared in the following manner.

A carrier sheet, formed of a 0.01 cm thick poly(ethylene terephthalate), was coated with the release layer formulation shown in the following TABLE I using a #10 wound-wire coating rod. The resulting coating was dried to provide a coating coverage of about 216 mg/m².

TABLE I

| Release Layer Formulation Component | Formulation Amount (grams) |
|---|---|
| PVA 523 | 50.0 |
| TRITON ® X-100 surfactant | 1.0 |
| Deionized water | 39.0 |
| n-Propanol | 10.0 |

A barrier layer formulation was formed with the components listed in the following TABLE II and applied to the dried release layer using a #10 wound-wire coating rod. The resulting coating was dried at about 82° C. for 3 minutes to form a barrier layer to provide a coating coverage of about 378 mg/m$^2$.

TABLE II

| Barrier Layer Formulation Component | Formulation Amount (grams) |
|---|---|
| PCA | 42.43 |
| PC 364 | 0.56 |
| PC 4432 | 0.30 |
| Acetone | 46.51 |
| Cyclohexane | 10.20 |

On the dried barrier layer, an imageable layer was formed using one of the formulations listed in the following TABLE III using a #20 wound-wire coating rod. The resulting coatings were dried at about 82° C. for 3 minutes to form imageable layers on the barrier layer at a coating coverage of about 1.94 g/m$^2$.

TABLE III

| Imageable Layer Formulation Component | Control Formulation (grams) | Control Layer (wt. % dry layer) | Example 1 Formulation (grams) | Example 1 Layer (wt. % dry layer) | Example 2 Formulation (grams) | Example 2 Layer (wt. % dry layer) |
|---|---|---|---|---|---|---|
| Sudan Black | 0.62 | 7.8 | 0.62 | 7.8 | 0.62 | 7.8 |
| UVINUL ® 3050 | 0.80 | 10.0 | 0.80 | 10.0 | 0.80 | 10.0 |
| Curcumin | 1.60 | 20.0 | 1.60 | 20.0 | 1.60 | 20.0 |
| Nitrocellulose | 45.1 | 28.2 | 15.9 | 10.0 | 29.8 | 18.6 |
| BUTVAR ® B76 | 8.3 | 10.4 | 6.9 | 8.7 | 0 | 0 |
| EPOLIGHT ™ 1178 | 2.0 | 12.5 | 1.0 | 12.5 | 1.0 | 12.5 |
| CK-2500 | 0 | 0 | 15.9 | 19.9 | 15.9 | 19.9 |
| IR Dye A | 9.42 | 5.3 | 0.42 | 5.3 | 0.42 | 5.3 |
| SANTICIZER ® 160 | 0.37 | 4.6 | 0.37 | 4.6 | 0.37 | 4.6 |
| SYLOJET ® P405 | 0.10 | 1.3 | 0.10 | 0 | 0.10 | 0 |
| MEK | 20 | 0 | 20 | 0 | 20 | 0 |
| Cyclohexanone | 10 | 0 | 10 | 0 | 10 | 0 |
| Solvent PM | 11.4 | 0 | 26.1 | 0 | 19.1 | 0 |

The imageable layers on each film were tested for developer compatibility by contacting the solvents shown in TABLE IV on the outermost imageable layer of each film for 60 seconds to see how much of the top imageable layer was removed. The results of this test are also shown in TABLE IV. The evaluations of the developer were as follows:

TABLE IV

| Developer | Control | Example 1 | Example 2 |
|---|---|---|---|
| Solvit ® QD | Fair | Very good | Good |
| Nylosolv ® | Poor | Very good | Very good |
| Flexosol ® | Fair | Good | Fair |
| OptiSol ® | Excellent | Excellent | Excellent |
| Platesolv | Fair | Good | Good |

Poor: Only 10–20% of coating removed
Fair: Significant coating remaining
Good: Most of the coating was removed (60–75%)
Very good: 75–90% of coating removed
Excellent: >90% of coating removed The data show that the imageable layers used in the films of the present invention, containing CK-2500 at more than 50 weight % of total polymeric binders were considerably more compatible (removable) by all of the tested developers, including the non-chlorinated hydrocarbon developers, than the Control film. Thus, the films of the present invention can be used to provide mask images on radiation-sensitive elements that are developed using both chlorinated and non-chlorinated developers.

Example 3

Imaging of Films and Determination of Sensitivity

This example was used to demonstrate the imaging sensitivity of the Control and Example 1 and 2 films.

The films were imaged on each of an ECRM DesertCat 88 Imager (830 nm exposure wavelength) and an ESKO CDI Imager (1060 nm exposure wavelength). The results are shown in the following TABLES V (830 nm exposure) and VI (1060 nm exposure).

TABLE V

| Exposure Energy (J/cm$^2$) | Control | Example 1 | Example 2 |
|---|---|---|---|
| 0.80 | 0.10 | 0.10 | 0.10 |
| 0.85 | 0.10 | 0.10 | 0.10 |
| 0.90 | 0.09 | 0.10 | 0.10 |
| 1.00 | 0.09 | 0.10 | 0.10 |
| 1.20 | 0.08 | 0.10 | 0.10 |
| 1.40 | 0.07 | 0.09 | 0.09 |
| 1.60 | 0.07 | 0.09 | 0.10 |

TABLE VI

| Exposure Energy (J/cm$^2$) | Control | Example 1 | Example 2 |
|---|---|---|---|
| 0.83 | 0.17 | 0.19 | 0.22 |
| 0.88 | 0.15 | 0.17 | 0.19 |
| 0.94 | 0.06 | 0.08 | 0.11 |
| 1.10 | 0.04 | 0.05 | 0.05 |
| 1.32 | 0.04 | 0.05 | 0.04 |
| 1.65 | 0.05 | 0.05 | 0.04 |

These data show that there is essentially no loss in sensitivity when the films of the present invention were imaged compared to the Control film. The TOD (max) of the Example 1 and 2 films was 3.5-3.8, which is indicative of the high UV opacity of the non-imaged areas.

Example 4

Best Mode Film

A carrier sheet, formed of a 0.01 cm thick poly(ethylene terephthalate), was coated with the release layer formulation shown in the following TABLE VII using a #10 wound-wire coating rod. The resulting coating was dried to provide a coating coverage of about 216 mg/m².

TABLE VII

| Release Layer Formulation Component | Formulation Amount (grams) | Weight % in Dry Coated Layer |
| --- | --- | --- |
| GANTREZ ® S-97 BF resin (10% solids) | 4.3 | 53.7 |
| AIRVOL ® 205 premix solution (10% solids) | 2.86 | 35.8 |
| PEG-400 polyethylene glycol solution (10% solids) | 0.40 | 5.0 |
| RICOBOND ® 2031 (5% solids) | 0.40 | 2.5 |
| TRITON ® X-100 surfactant (10% solids) | 0.24 | 3.0 |
| Deionized water | 71.80 | 0 |
| n-Propanol | 20.0 | 0 |

A barrier layer formulation was formed with the components listed in the following TABLE VIII and applied to the dried release layer using a #10 wound-wire coating rod. The resulting coating was dried at about 82° C. for 3 minutes to form a barrier layer to provide a coating coverage of about 378 mg/m².

TABLE VIII

| Barrier Layer Formulation Component | Formulation Amount (grams) | Weight % in Dry Coated Layer |
| --- | --- | --- |
| PCA (10% in acetone: cyclopentanone 50:50) | 38.25 | 76.0 |
| EPOLIGHT ® 1178 | 0.825 | 16.4 |
| D99 | 0.350 | 7.0 |
| FC 55/35/10 (7.5% solids) | 0.400 | 0.006 |
| Acetone | 46.51 | 0 |
| Cyclopentanone | 10.20 | 0 |

On the dried barrier layer, an imageable layer was formed using the formulation listed in the following TABLE IX using a #20 wound-wire coating rod. The resulting coatings were dried at about 82° C. for 3 minutes to form imageable layers on the barrier layer at a coating coverage of about 1.94 g/m².

TABLE IX

| Imageable Layer Formulation Component | Formulation Amount (grams) | Weight % in Dry Coated Layer |
| --- | --- | --- |
| Sudan Black | 1.07 | 7.8 |
| UVINUL ® 3050 | 0.82 | 6.0 |
| Curcumin | 3.29 | 24.0 |
| Nitrocellulose premix | 13.7 | 5.0 |

TABLE IX-continued

| Imageable Layer Formulation Component | Formulation Amount (grams) | Weight % in Dry Coated Layer |
| --- | --- | --- |
| ELVACITE ® 2045 premix | 36.99 | 27.0 |
| EPOLIGHT ® 1178 | 1.84 | 13.4 |
| D99 | 1.27 | 9.3 |
| SANTICIZER ® 160 | 0.92 | 6.7 |
| SYLOJET ® P405 | 0.11 | 0.8 |
| FC 55/35/10 | 0.47 | 0.003 |
| MIBK | 14.53 | 0 |
| MEK | 20.0 | 0 |
| Cyclohexanone | 5.0 | 0 |

Example 5

Formation of Relief Image in Flexographic Printing Plate

This example demonstrates the use of a film of this invention to provide a relief image in a radiation-sensitive element that can be used as a flexographic printing plate.

The film of Example 4 was imaged as described in Example 3 at 830 nm to form a mask image. The mask image was transferred by lamination to a FLEXEL flexographic printing plate precursor commercially available from Kodak Polychrome Graphics, a subsidiary of Eastman Kodak Company (Norwalk, Conn.). The assembly masking film and flexographic printing plate precursor were exposed to curing ultraviolet radiation using a Kelleigh Model 310 Platemaker for 13 minutes to provide an imaged flexographic printing plate.

The assembly containing the imaged flexographic printing plate and mask were put in a solution of OPTISOL developer (non-chlorinated) for 20 minutes and 23° C. to remove the mask and provide a relief image in the flexographic printing plate.

Example 6

A carrier sheet, formed of a 0.01 cm thick poly(ethylene terephthalate), was coated with the release layer formulation shown in the following TABLE X using a #10 wound-wire coating rod. The resulting coating was dried to provide a coating coverage of about 216 mg/m².

TABLE X

| Release Layer Formulation Component | Formulation Amount (grams) | Weight % in Dry Coated Layer |
| --- | --- | --- |
| GANTREZ ® S-97 BF resin (10% solids) | 4.3 | 53.7 |
| AIRVOL ® 205 premix solution (10% solids) | 2.86 | 35.8 |
| PEG-400 polyethylene glycol solution (10% solids) | 0.40 | 5.0 |
| RICOBOND ® 2031 (5% solids) | 0.40 | 2.5 |
| TRITON ® X-100 surfactant (10% solids) | 0.24 | 3.0 |
| Deionized water | 71.80 | 0 |
| n-Propanol | 20.0 | 0 |

A barrier layer formulation was formed with the components listed in the following TABLE XI and applied to the dried release layer using a #10 wound-wire coating rod. The resulting coating was dried at about 82° C. for 3 minutes to form a barrier layer to provide a coating coverage of about 378 mg/m².

TABLE XI

| Barrier Layer Formulation Component | Formulation Amount (grams) | Weight % in Dry Coated Layer |
|---|---|---|
| PCA (10% in acetone: cyclohexanone 50:50) | 38.25 | 76.0 |
| EPOLIGHT ® 1178 | 0.825 | 16.4 |
| D99 | 0.350 | 7.0 |
| FC 55/35/10 (7.5% solids) | 0.400 | 0.006 |
| Acetone | 46.51 | 0 |
| Cyclopentanone | 10.20 | 0 |

On the dried barrier layer, an imageable layer was formed using the formulation listed in the following TABLE XII using a #20 wound-wire coating rod. The resulting coatings were dried at about 82° C. for 3 minutes to form imageable layers on the barrier layer at a coating coverage of about 1.94 g/m².

TABLE XII

| Imageable Layer Formulation Component | Formulation Amount (grams) | Weight % in Dry Coated Layer |
|---|---|---|
| Sudan Black | 0.42 | 7.8 |
| UVINUL ® 3050 | 0.54 | 10.0 |
| Curcumin | 1.60 | 29.4 |
| Nitrocellulose premix (5% solids in MIBK) | 5.44 | 5.0 |
| NeoRez 322 polyurethane (75% solids) | 1.74 | 24.0 |
| EPOLIGHT ® 1178 | 0.76 | 14.0 |
| D99 | 0.49 | 9.0 |
| SYLOJET ® P405 | 0.04 | 0.8 |
| FC 55/35/10 (7.5% solids) | 0.19 | 0.003 |
| MIBK | 16.77 | 0 |
| MEK | 8.0 | 0 |
| Cyclohexanone | 2.0 | 0 |
| Ethanol | 2.0 | 0 |

This film was used to form a relief image in a flexographic printing plate as described in Example 5.

The invention has been described in detail with particular reference to certain preferred embodiments thereof, but it will be understood that variations and modifications can be effected within the spirit and scope of the invention.

The invention claimed is:

1. A film comprising a carrier sheet and having thereon an ablative imageable layer comprising a colorant and an infrared radiation absorbing compound dispersed in a polymeric binder that is a resin that can be dissolved or dispersed in cyclohexane at 10% solids at 23° C. within 24 hours, said polymeric binder being a terpene resin, phenolic resin, or an aromatic hydrocarbon resin.

2. The film of claim 1 wherein said polymeric binder is present in said imageable layer in an amount of from about 25 to about 75 dry weight %.

3. The film of claim 1 wherein said infrared radiation absorbing compound is an IR dye and said colorant is a UV-absorbing dye.

4. The film of claim 1 further comprising a release layer disposed between said imageable layer and said carrier sheet.

5. The film of claim 4 wherein said release layer comprises a poly(vinyl alcohol), a cellulosic polymer, or hydrolyzed styrene maleic anhydride.

6. The film of claim 1 further comprising a barrier layer disposed between said imageable layer and said carrier sheet, said barrier layer optionally including an infrared absorbing compound.

7. The film of claim 6 wherein said barrier layer comprises a heat-combustible polymer binder.

8. The film of claim 1 wherein said carrier sheet is transparent.

9. A method of making a relief image, the method comprising:
A) forming a mask image by forming exposed and non-exposed regions in a film that comprises a carrier sheet and having thereon an ablative imageable layer comprising a colorant and an infrared radiation absorbing compound dispersed in a polymeric binder that is a resin that can be dissolved or dispersed in cyclohexane at 10% solids at 23° C. within 24 hours, which polymeric binder is a terpene resin, phenolic resin or an aromatic hydrocarbon resin,
B) transferring said mask image to a radiation-sensitive element such that the imageable layer adheres more to the radiation-sensitive element than to said carrier sheet,
C) exposing said radiation-sensitive element to curing radiation through said mask image to form an imaged element, wherein said mask image is opaque to said curing radiation, and
D) developing said imaged element to form a relief image.

10. The method of claim 9 wherein developing is carried out in a developer comprising predominantly non-chlorinated organic solvents.

11. The method of claim 10 wherein said developing is carried out in a developer comprising predominantly one or more long chain alcohols or aliphatic hydrocarbons.

12. The method of claim 9 wherein said film further comprises a receptor sheet in contact with said imageable layer, and said exposed regions are transferred to said receptor sheet, whereupon said receptor sheet is removed from said film.

13. The method of claim 9 wherein said polymeric binder is present in said imageable layer in an amount of from about 25 to about 75 dry weight %, said infrared radiation absorbing compound is an IR dye and said colorant is a UV-absorbing dye.

14. The method of claim 9 further comprising a release layer disposed between said imageable layer and said carrier sheet that is transparent.

15. The method of claim 9 further comprising a barrier layer disposed between said imageable layer and said carrier sheet that is transparent, said barrier layer optionally including an IR dye.

16. The method of claim 9 wherein said carrier sheet is non-transparent and it removed between steps B and C.

17. A method of making a relief image, the method comprising:
A) forming a mask image by forming exposed and non-exposed regions in a film that comprises a transparent carrier sheet and having thereon, in order, a release layer, a barrier layer, and an ablative imageable layer comprising a UV-absorbing dye and an infrared absorbing compound dispersed in a polymeric binder that is an iso-butyl methacrylate polymer, B) transferring said mask image to a UV-sensitive element such that the imageable layer adheres more to the UV-sensitive element than to the transparent carrier sheet, C) exposing said UV-sensitive element to UV radiation through said mask image to form an imaged element, wherein said mask image is opaque to said UV radiation, and D) developing said imaged element to form a relief image in a developer comprising predominantly one or more long chain alcohols or aliphatic hydrocarbons.

18. The method of claim 17 wherein said UV-sensitive element is a flexographic printing plate precursor and said imaged element is a flexographic printing plate.

19. A method of making a relief image, the method comprising:

A) forming a mask image by forming exposed and non-exposed regions in a film that comprises a carrier sheet and having thereon an ablative imageable layer comprising a colorant and an infrared radiation absorbing compound dispersed in a polymeric binder that is a resin that can be dissolved or dispersed in cyclohexane at 10% solids at 23° C. within 24 hours, which polymeric binder is an iso-butyl methacrylate polymer, B) transferring said mask image to a radiation-sensitive element such that the imageable layer adheres more to the radiation-sensitive element than to said carrier sheet, C) exposing said radiation-sensitive element to curing radiation through said mask image to form an imaged element, wherein said mask image is opaque to said curing radiation, and D) developing said imaged element to form a relief image.

* * * * *